United States Patent [19]

Watanabe et al.

[11] Patent Number: 5,032,539
[45] Date of Patent: Jul. 16, 1991

[54] METHOD OF MANUFACTURING GREEN LIGHT EMITTING DIODE

[75] Inventors: Masayuki Watanabe, Yokohama; Masahiro Nakajima, Yokosuka, both of Japan

[73] Assignee: Kabushiki Kaisha Toshiba, Kawasaki, Japan

[21] Appl. No.: 375,961

[22] Filed: Jul. 6, 1989

[30] Foreign Application Priority Data

Jul. 8, 1988 [JP] Japan ................ 63-170253

[51] Int. Cl.$^5$ ............................ H01L 21/208
[52] U.S. Cl. ........................ 437/127; 437/130; 437/133; 437/905; 148/DIG. 66
[58] Field of Search ............ 437/127, 130, 133, 2, 437/5, 184, 904, 905, 126; 148/DIG. 65, DIG. 66, DIG. 101; 357/17, 19, 29, 30

[56] References Cited

U.S. PATENT DOCUMENTS

| | | | |
|---|---|---|---|
| 3,844,904 | 10/1974 | Yahalom | 204/56.1 |
| 3,868,281 | 2/1975 | Morgan | 437/127 |
| 3,969,164 | 7/1976 | Cho et al. | 437/107 |
| 4,001,056 | 1/1977 | Groves et al. | 437/127 |
| 4,008,106 | 2/1977 | Gutierrez et al. | 437/117 |
| 4,032,370 | 6/1977 | Mataré | 437/121 |
| 4,256,520 | 3/1981 | Kolke et al. | 437/114 |
| 4,498,225 | 2/1985 | Gutierrez et al. | 437/81 |

FOREIGN PATENT DOCUMENTS

| | | | |
|---|---|---|---|
| 0102192 | 3/1984 | European Pat. Off. | |
| 0102734 | 3/1984 | European Pat. Off. | 437/127 |
| 0038074 | 10/1974 | Japan | 437/127 |
| 0026480 | 3/1981 | Japan | 437/127 |
| 0016391 | 1/1984 | Japan | 437/127 |
| 0023579 | 2/1984 | Japan | 437/127 |
| 0214276 | 12/1984 | Japan | 437/127 |
| 0151086 | 6/1988 | Japan | 437/127 |

OTHER PUBLICATIONS

EPO Search Report for European Application No. 89112649.5.
"Hemispherical GaP:N Green Electroluminesent Diodes", by Bachrach et al., Solid State Electronics, vol. 16, pp. 1037-1042, 1973, Pergammon Press.

*Primary Examiner*—Olik Chaudhuri
*Assistant Examiner*—M. Wilczewski
*Attorney, Agent, or Firm*—Finnegan, Henderson, Farabow, Garrett and Dunner

[57] ABSTRACT

In a method of manufacturing a green diode, an included angle defined by a line extending along the longitudinal direction of light and dark stripes of an oxide region formed on a cleavage surface of a GaP single crystal wafer and a surface of the wafer is set to be a predetermined angle, and a liquid phase epitaxial layer having a p-n junction is formed on the surface of the GaP single crystal wafer.

8 Claims, 2 Drawing Sheets

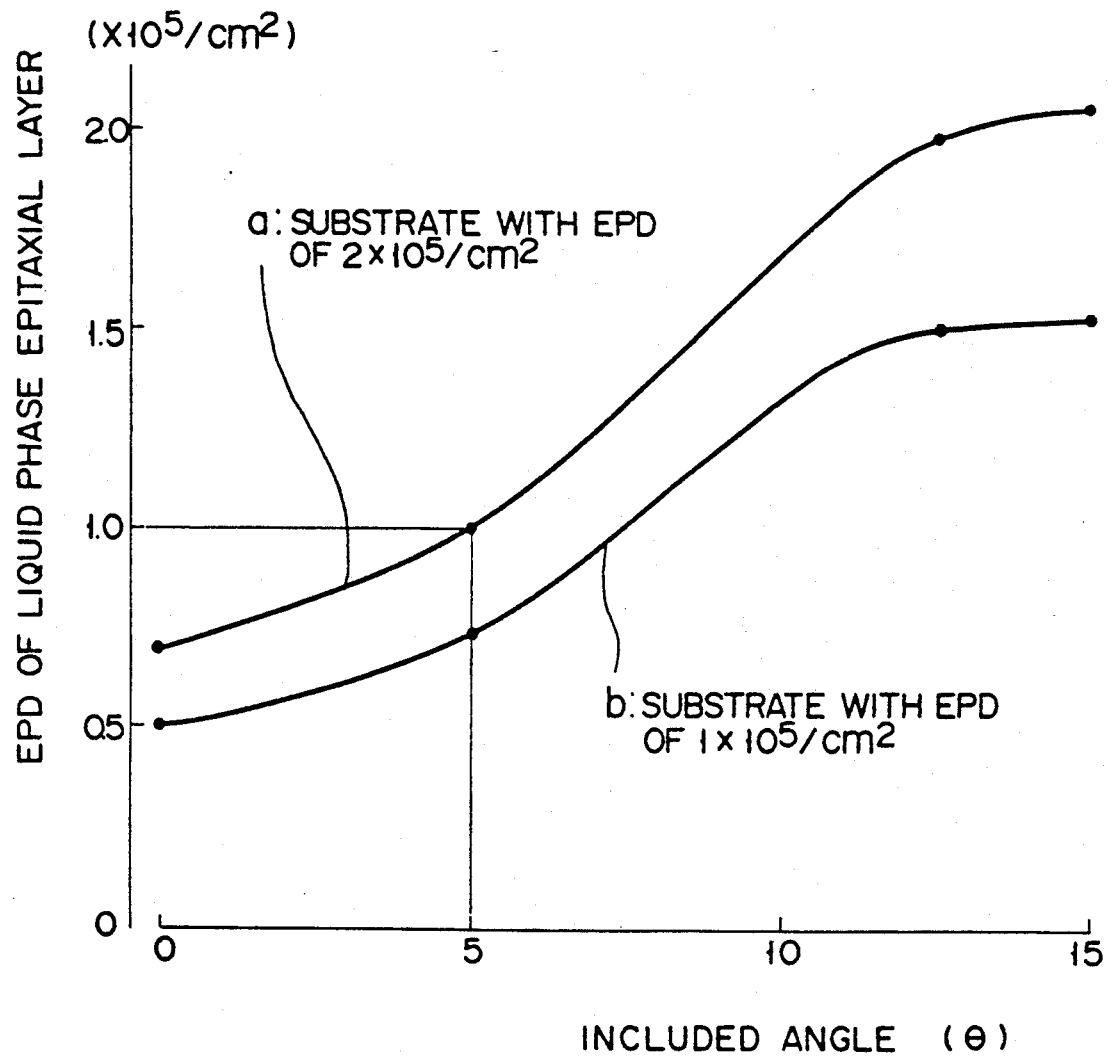
F I G. 1

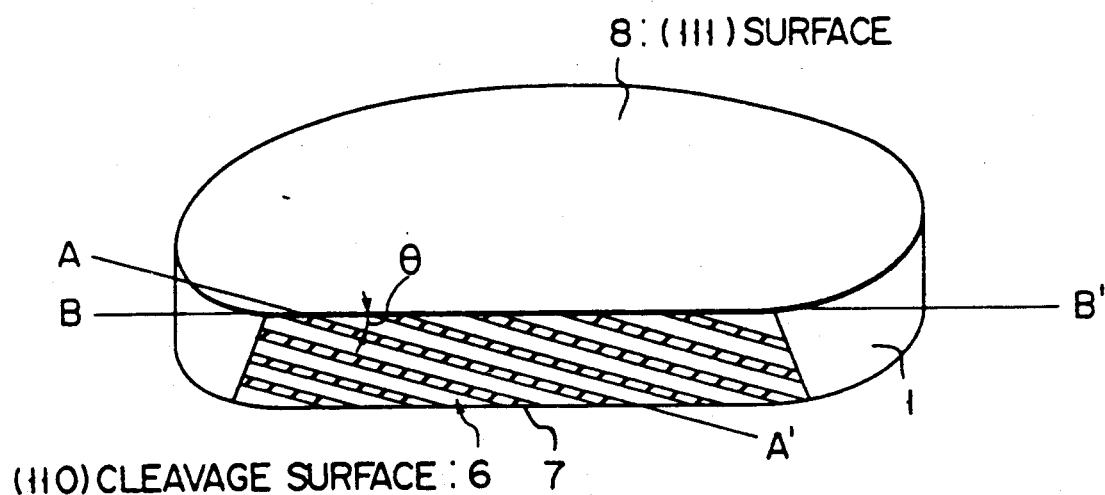
F I G. 2

METHOD OF MANUFACTURING GREEN LIGHT EMITTING DIODE

BACKGROUND OF THE INVENTION

1. Field of the Invention

The present invention relates to a method of manufacturing a green light emitting diode (to be referred to as an LED hereinafter).

2. Description of the Related Art

A green LED is manufactured by epitaxially forming a p-n junction layer on a GaP crystal substrate by LPE (Liquid Phase Epitaxy). FIG. 3 is a sectional view of a main part of a green LED. Referring to FIG. 3, reference numeral 1 denotes an n-type semiconductor substrate doped with sulfur (S), tellurium (Te), or the like. N- and p-type layers 2 and 3 respectively containing, e.g., Si and Zn as a donor and an acceptor are sequentially formed on an N-type region of (111) major surface of the substrate 1. Subsequently, in order to obtain high luminous efficacy, nitrogen is doped in the N-type layer 2 to form a nitrogen (N) isoelectronic trap necessary for recombination light emission of excitons. In addition, an anode 4 is formed on the p-type layer 3, and a cathode 5 is formed on the lower surface of the semiconductor substrate 1. When a current flows between the anode 4 and the cathode 5 of the green LED having this arrangement, light emission occurs upon recombination of excitons trapped in the N isoelectronic trap as a luminescent center.

In this case, the emission wavelength is about 565 $\mu$m, and the thicknesses of the n- and p-type layers 2 and 3 are set to be 25 $\mu$m to 50 $\mu$m.

The luminous efficacy is influenced by a concentration of nitrogen to be doped, a carrier concentration distribution near a p-n junction, and the lifetime of minority carriers injected in a junction. It is known that there is a high correlation between the lifetime of minority carriers and the etch pit density (to be referred to as the EPD hereinafter) of an epitaxial layer. The lifetime is abruptly shortened at an EPD of $1 \times 10^5$/cm$^2$ or more, and the luminous efficacy is also decreased accordingly.

Since a GaP crystal has a wide band gap, an impurity level serving as a non-emission recombination center is easily set. In addition, in a green LED, since the light emission level is shallow, excitons trapped in the N isoelectronic trap are thermally dissociated, and the possibility that non-emission recombination occurs after the dissociation of excitons is high. For this reason, it is important to suppress the EPD of an epitaxial layer as a non-emission recombination center to $1 \times 10^5$/cm$^2$.

Since the EPD of an epitaxial layer tends to copy the EPD of a substrate, it is important to use a low-EPD substrate for a green LED. However, a GaP single crystal used as a substrate is manufactured by LEC (Liquid Encapsulated Czochoralski) under a severe thermal environment of high temperature and pressure (1,467° C. or more and 50 atm). For this reason, it is difficult to manufacture a single crystal having an EPD of $1 \times 10^5$/cm$^2$ with a high yield, and demands for stable supply and a decrease in cost cannot be satisfied.

As described above, in order to increase the luminous efficacy of a GaP green LED, it is very important to suppress the EPD of an epitaxial layer contained in the GaP substrate to a low value. In conventional techniques, however, since GaP crystals are grown under a severe environment of high temperature and pressure, it is difficult to stably manufacture an ingot having a sufficiently low EPD at a low cost. A strong demand has arisen on the market for a wider application range of green LEDs and higher external luminous efficacy.

SUMMARY OF THE INVENTION

It is an object of the present invention to provide a method of manufacturing a green light emitting diode, by which green LEDs having high external luminous efficacies can be manufactured at a low cost with high reproducibility by using commercially available GaP substrates.

According to the present invention, there is provided a method of manufacturing a green light emitting diode wherein an included or inclination angle defined by a line extending along a longitudinal direction of light and dark stripes of an oxide region formed on a cleavage surface of a GaP single crystal wafer and a (111) surface of the wafer is set to be a predetermined angle, and a liquid phase epitaxial layer having a p-n junction is formed on the (111) surface of the GaP single crystal wafer.

The present invention has been made on the basis of the following relationship between EPDs and included angles.

FIG. 1 shows relationships between the EPDs and the included angles of n-type GaP single crystal wafers of different lots, which are manufactured by the LEC method, i.e., two types of wafers respectively having (111) major surfaces with EPDs of $2 \times 10^5$/cm$^2$ and of $1 \times 10^5$/cm$^2$. On the abscissa axis, an included angle defined by a line along the longitudinal direction of light and dark stripes obtained by anodization of a (110) cleavage surface of a wafer and the (111) major surface is plotted. On the ordinate axis, an EPD on a layer obtained by stacking n- and p-type layers by the LPE method is plotted. Curves a and b respectively represent the relationships between the included angles of the wafers respectively having EPDs of $2 \times 10^5$/cm$^2$ and of $1 \times 10^5$/cm$^2$ and the EPDs of the LPE layers.

It is apparent from FIG. 1 that in the low-EPD substrates each having an EPD of $1 \times 10^5$/cm$^2$ and even in commercially available substrates each having an EPD of $2 \times 10^5$/cm$^2$, as the included angles are decreased, the EPDs of the LPE layers are decreased, and that desired low-EPD growth can be realized if the included angles are within 5°.

BRIEF DESCRIPTION OF THE DRAWINGS

FIG. 1 is a graph showing a relationship between included angles and the EPDs of LPE layers;

FIG. 2 is a perspective view showing a GaP (110) cleavage surface, light and dark stripes, and included angles.

DETAILED DESCRIPTION OF THE PREFERRED EMBODIMENTS

Figure 3:
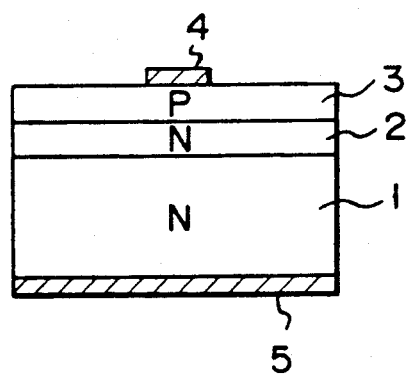
FIG. 3 is a sectional view showing a conventional green LED.

An embodiment of the present invention will be described below with reference to the accompanying drawings.

Fifty wafers are prepared from a sulfur-doped n-type GaP single crystal ingot having a diameter of 50 mm which is pulled/formed in a direction of the <111> axis by the LEC method. Each wafer has an EPD of $2 \times 10^5$ /cm$^2$ and an electron concentration (substantially equivalent to an S concentration) of $2 \times 10^{17}$ /cm$^3$.

Light and dark stripes of an oxide region are formed on a (110) cleavage surface of each wafer of this lot by performing anodization in, e.g., a 1N KOH aqueous solution.

Anodization conditions may be set such that a distinguishable oxide region can be formed by energization with, e.g., a current of several mA for several minutes. FIG. 2 shows light and dark stripes 7 obtained in this manner. A large number of stripes 7 are obliquely formed on a (110) cleavage surface 6 of an n-type GaP single crystal wafer 1.

Upon examination, it was found that an included angle $\theta$ defined by a line B—B' formed at a portion where the (110) cleavage surface 6 and a (111) p-type surface 8 cross each other and a line A—A' extending along the longitudinal direction of the stripes 7 is uniformly set to be within 5°.

After the oxide region is removed, n- and p-type layers in which Si and Zn are respectively doped at, e.g., average concentrations of $1 \times 10^{16}$ /cm$^3$ and of $1 \times 10^{17}$ /cm$^3$ by a slide board method are formed on the (111) p-type surface 8 of the major surface of the wafer by the LPE method. In addition, an anode is formed on the p-type layer, and a cathode 5 is formed on the lower surface of the substrate, thereby obtaining a green LED having the same structure as that shown in FIG. 3. In this case, the EPD of the LPE layer was decreased to $1 \times 10^5$ /cm$^2$ or less, i.e., ½ that of the conventional LED shown in FIG. 3, as shown by curve a in FIG. 1.

In addition, the average external luminous efficacy of the obtained green LEDs was 0.5%, and a standard deviation $\delta$ was kept within 10%. In contrast to this, the average external luminous efficacy of the conventional green LEDs is 0.35%, and their luminous efficacies greatly vary from 0.20 to 0.50%. Wafers of the respective lots were extracted to check included angles defined by the (111) surfaces 8 and the light and dark stripes of the (110) surfaces 6 of anodized films, so that lots having included angles less than 5° were selected as materials for high-luminance LEDs, as in this embodiment. As a result, the yield of green LEDs was greatly increased.

In the embodiment, an S-doped n-type GaP crystal is exemplified. However, the same effects can be obtained by using n-type crystals doped with other impurities such as Te and Si.

As has been described above, according to the present invention, even by using commercially available GaP substrates each having an EPD of $2 \times 10^5$ /cm$^2$, green LEDs having high external luminous efficacies for high luminance can be manufactured at a low cost with excellent reproducibility, and the yield can also be increased. If low-EPD substrates are used, green LEDs having higher external luminous efficacies can be obtained. Therefore, the present invention is very advantageous for industrial applications.

What is claimed is:

1. A method of manufacturing a green diode comprising the steps of:

selecting a GaP single crystal wafer having light and dark stripes of an oxide region formed on a cleavage surface of said GaP single crystal wafer at an inclination angle which is not more than a predetermined angle, said inclination angle being defined by a line extending along a longitudinal direction of said light and dark stripes and a surface of said GaP single crystal wafer; and forming a layer by liquid phase epitaxy having a p-n junction on said surface of the GaP single crystal wafer.

2. A method according to claim 1, wherein the light and dark stripes are formed on a (110) cleavage surface of the wafer by anodization in a 1N KOH aqueous solution.

3. A method according to claim 2, wherein anodization conditions are set such that a distinguishable oxide region is formed on said cleavage surface by energization with a current of several mA for several minutes.

4. A method according to claim 1, wherein one element selected from the group consisting of S, Te, and Si is doped in the GaP single crystal wafer.

5. A method according to claim 1, wherein an etch pit density (EPD) of an epitaxial layer of the GaP single crystal wafer is $2 \times 10^5$ /cm$^2$.

6. The method of claim 1, wherein the dark and light stripes are formed by oxidizing said cleavage surface of said GaP single crystal wafer.

7. The method of claim 6, wherein the oxidizing of said cleavage surface is carried out by anodization.

8. The method of claim 1, wherein said predetermined angle is 5°.

* * * * *